United States Patent
Aoki

(10) Patent No.: US 10,370,241 B2
(45) Date of Patent: Aug. 6, 2019

(54) PHYSICAL QUANTITY DETECTION DEVICE, ELECTRONIC APPARATUS, AND MOVING OBJECT

(71) Applicant: Seiko Epson Corporation, Tokyo (JP)

(72) Inventor: Shinya Aoki, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 859 days.

(21) Appl. No.: 14/854,746

(22) Filed: Sep. 15, 2015

(65) Prior Publication Data

US 2016/0075549 A1     Mar. 17, 2016

(30) Foreign Application Priority Data

Sep. 16, 2014  (JP) ................................ 2014-187354

(51) Int. Cl.
*H01L 41/08* (2006.01)
*B81B 3/00* (2006.01)

(52) U.S. Cl.
CPC .... *B81B 3/0086* (2013.01); *B81B 2201/0285* (2013.01); *B81B 2203/04* (2013.01)

(58) Field of Classification Search
CPC .................................................. B81B 3/0086
USPC ................. 310/338, 370, 311, 348, 366, 367
See application file for complete search history.

(56) References Cited

U.S. PATENT DOCUMENTS

| | | | |
|---|---|---|---|
| 8,624,339 B2* | 1/2014 | Matsukawa | G01C 19/5628 257/415 |
| 2006/0107739 A1 | 5/2006 | Ogura | |
| 2013/0026583 A1 | 1/2013 | Matsukawa et al. | |
| 2013/0328444 A1 | 12/2013 | Aoki et al. | |

FOREIGN PATENT DOCUMENTS

| | | |
|---|---|---|
| JP | H10-206165 A | 8/1998 |
| JP | 2008-003011 A | 1/2008 |
| JP | 2010-002430 A | 1/2010 |
| JP | 2011-226928 A | 11/2011 |
| JP | 2012-172970 A | 9/2012 |
| JP | 2013-030850 A | 2/2013 |
| JP | 2013-253895 A | 12/2013 |

* cited by examiner

*Primary Examiner* — Thomas M Dougherty
*Assistant Examiner* — Karen B Addison
(74) *Attorney, Agent, or Firm* — Oliff PLC

(57) ABSTRACT

A physical quantity detection device includes a semiconductor element and a physical quantity detection vibrator element a portion of which overlaps the semiconductor element in a plan view of the semiconductor element. The physical quantity detection vibrator element includes a drive portion including a drive electrode, and a detection portion. At least a partial region of the drive electrode does not overlap the semiconductor element in the plan view of the semiconductor element.

12 Claims, 7 Drawing Sheets

PHYSICAL QUANTITY DETECTION DEVICE, ELECTRONIC APPARATUS, AND MOVING OBJECT

BACKGROUND

1. Technical Field

The present invention relates to a physical quantity detection device, and an electronic apparatus and a moving object both using the physical quantity detection device.

2. Related Art

In the related art, a vibrating device that senses acceleration, angular velocity, or the like is known as one example of physical quantity detection devices. The vibrating device includes a physical quantity detection vibrator element and a semiconductor element having a function of driving the physical quantity detection vibrator element and a function of detecting physical quantity.

As such a vibrating device, JP-A-2012-172970 discloses a sensor device (vibrating device) in which a vibrating gyro element as the physical quantity detection vibrator element and a silicon substrate as the semiconductor element are disposed at positions overlapping each other in a plan view of the silicon substrate.

Moreover, JP-A-2013-030850 discloses a vibrating device in which a gyro element (vibrating element) and an IC chip (semiconductor element) are disposed side by side at positions not overlapping each other in a plan view of a package.

In the vibrating device disclosed in JP-A-2012-172970, however, since an entire drive electrode (drive portion) overlaps the silicon substrate in the plan view of the silicon substrate, electrical noise generated due to a current flowing into the drive portion is likely to interfere with a circuit configured in the silicon substrate, thereby involving the risk of influencing detection accuracy.

Moreover, in the vibrating device disclosed in JP-A-2013-030850, since the gyro element and the IC chip are disposed next to each other (side by side) at positions not overlapping each other in a plan view of the IC chip, the vibrating device involves the risk of an increase in its planar size.

SUMMARY

An advantage of some aspects of the invention is to solve the problems described above, and the invention can be implemented as the following forms or application examples.

Application Example 1

A physical quantity detection device according to this application example includes: a semiconductor element; and a physical quantity detection vibrator element, a portion of which overlaps the semiconductor element in a plan view of the semiconductor element, wherein the physical quantity detection vibrator element includes a drive portion including a drive electrode, and a detection portion, and at least a partial region of the drive electrode does not overlap the semiconductor element in the plan view of the semiconductor element.

According to this application example, at least a portion of the drive electrode is disposed at a position not overlapping the semiconductor element. Therefore, compared to a related-art physical quantity detection device in which the entire drive portion overlaps the semiconductor element, the drive electrode disposed in the drive portion has a small area facing a circuit of the semiconductor element.

As a result, a stray capacitance generated between the drive electrode and the semiconductor element can be reduced, and at the same time, the influence of electric and magnetic fields generated from the drive electrode on the semiconductor element is also reduced. Therefore, the influence of electrical noise generated from the drive electrode on the semiconductor element can be minimized.

Further, since the physical quantity detection vibrator element and the semiconductor element are accommodated in a package in an overlapping manner in the plan view of the semiconductor element, the physical quantity detection device is miniaturized with a reduction in its planar size.

Application Example 2

In the physical quantity detection device according to the application example described above, the physical quantity detection vibrator element is disposed on an active surface side of the semiconductor element.

According to this application example, the drive electrode and an electrode for the detection portion (hereinafter referred to as "detection electrode") formed in the detection portion of the physical quantity detection vibrator element can be directly connected with pad electrodes for drive and detection circuits of the semiconductor element. Therefore, since a wiring or the like for establishing electrical continuity between the electrodes of the physical quantity detection vibrator element and the pad electrodes of the semiconductor element can be eliminated or shortened, it is possible to reduce the influence of electrical noise.

Application Example 3

In the physical quantity detection device according to the application example described above, the detection portion overlaps the semiconductor element in the plan view of the semiconductor element.

According to this application example, since the detection electrode generates less electrical noise compared to the drive electrode, even when the detection electrode is disposed at a position overlapping the semiconductor element, the semiconductor element is less likely to be influenced by the electrical noise. Therefore, the planar size can be reduced, and thus the physical quantity detection device can be miniaturized.

Application Example 4

In the physical quantity detection device according to the application example described above, the physical quantity detection vibrator element includes a base portion, and a support portion extending from the base portion, the support portion is connected at a fixing position of the semiconductor element, and the detection portion is disposed between the base portion and the fixing position in the plan view of the semiconductor element.

According to this application example, the detection portion is configured so as to be disposed between the base portion and the support portion, so that the support portion for holding the physical quantity detection vibrator element above the semiconductor element can be lengthened, and thus it is possible to reduce the transmission of strain due to fixation to the base portion via the support portion. Hence, it is possible to obtain the physical quantity detection device with high accuracy in which the influence of the strain caused by holding the physical quantity detection vibrator element is reduced.

Application Example 5

In the physical quantity detection device according to the application example described above, in the plan view of the semiconductor element, the drive portion includes a first drive portion and a second drive portion, and the semiconductor element is disposed between the first drive portion and the second drive portion.

According to this application example, since the semiconductor element is disposed between the first drive portion and the second drive portion, it is possible to make it difficult for electrical noise generated due to a current flowing into the drive electrode to reach the detection circuit of the semiconductor element. Hence, the electrical noise does not interfere with the detection circuit of the semiconductor element which amplifies a feeble signal and detects the signal, so that a deterioration in detection accuracy for physical quantity can be reduced.

Application Example 6

In the physical quantity detection device according to the application example described above, the physical quantity detection vibrator element includes a base portion, a first coupling portion extending from the base portion along a first direction, and a second coupling portion extending from the base portion along a direction opposite to the first direction, the drive portion includes a first driving vibrating arm extending from the first coupling portion along a second direction intersecting the first direction, a second driving vibrating arm extending from the first coupling portion along a direction opposite to the second direction, a third driving vibrating arm extending from the second coupling portion along the second direction, and a fourth driving vibrating arm extending from the second coupling portion along the direction opposite to the second direction, and the detection portion includes a first detecting vibrating arm extending from the base portion along the second direction, and a second detecting vibrating arm extending from the base portion along the direction opposite to the second direction.

According to this application example, it is possible to detect angular velocity about an axis along a direction orthogonal to a plane formed by the first direction and the second direction. Moreover, vibration modes can be made symmetrical with the base portion as the central portion, so that the physical quantity detection device is resistant to external vibrations and shocks, and can obtain stable vibration characteristics. Hence, the influence of electrical noise can be reduced, and thus it is possible to reduce false detection of angular velocity or the like applied to the physical quantity detection device.

Application Example 7

In the physical quantity detection device according to the application example described above, the physical quantity detection vibrator element includes a base portion, the drive portion includes first and second driving vibrating arms extending from one edge of the base portion, and the detection portion includes first and second detecting vibrating arms extending from another edge of the base portion on the side opposite to the one edge.

According to this application example, it is possible to detect angular velocity about an axis along the extending direction of the first and second driving vibrating arms. Moreover, since the driving vibrating arm and the detecting vibrating arm extend from the respective edges of the base portion in the same axial direction, the drive electrode and the detection electrode are separated from each other.

Hence, electrical noise such as electrostatic coupling between the drive electrode and the detection electrode or between wirings is reduced, and thus detection sensitivity becomes stable. Further, by driving the first driving vibrating arm and the second driving vibrating arm together, excitation efficiency can be improved to reduce the equivalent series resistance value, and accordingly, consumption current can be reduced.

Application Example 8

An electronic apparatus according to this application example includes the physical quantity detection device according to any one of the application examples described above.

According to this application example, since the physical quantity detection device in which the influence of noise on the semiconductor element is reduced is used, it is possible to provide the electronic apparatus with stable characteristics and high reliability.

Application Example 9

A moving object according to this application example includes the physical quantity detection device according to any one of the application examples described above.

According to this application example, since the physical quantity detection device in which the influence of noise on the semiconductor element is reduced is used, it is possible to provide the moving object with stable characteristics and high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings.

First Embodiment

As one example of a physical quantity detection device according to a first embodiment of the invention, a vibrating device 1 (gyro sensor) that detects angular velocity will be described with reference to FIGS. 1 and 2.

Figure 1:
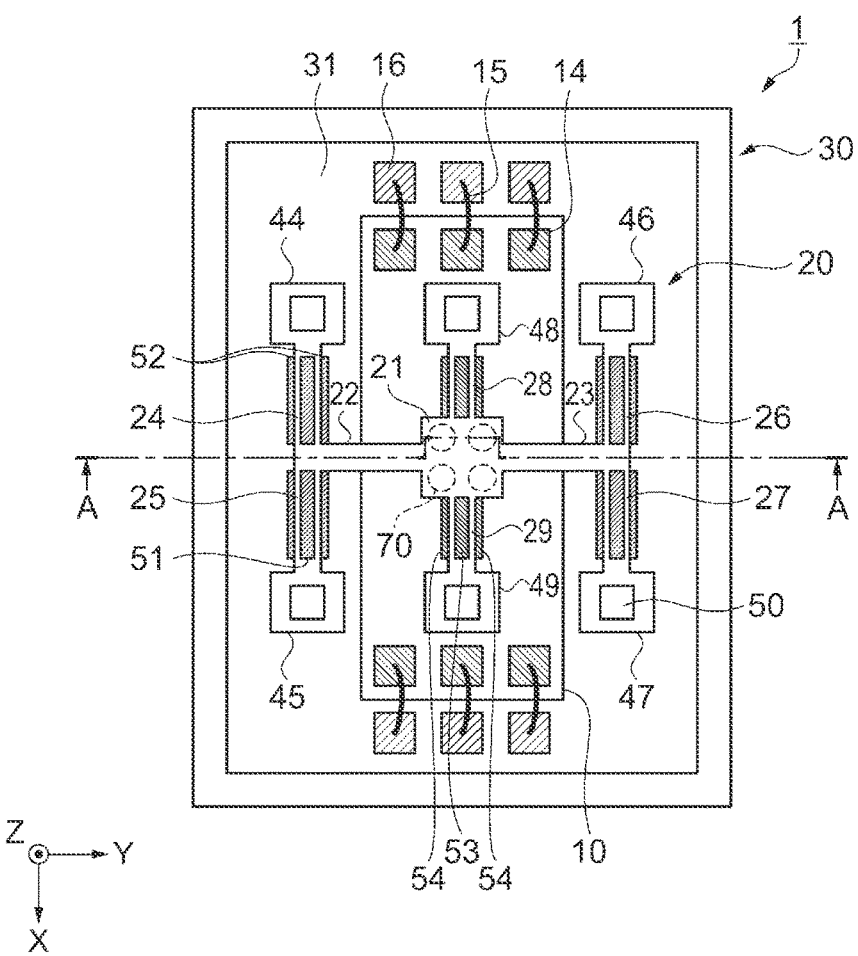
FIG. 1 is a plan view schematically showing a vibrating device as a physical quantity detection device according to a first embodiment.

FIG. 1 is a plan view schematically showing the vibrating device as the physical quantity detection device according to the first embodiment. FIG. 2 is a cross-sectional view taken along the line A-A in FIG. 1. In the drawings below, the scales of layers or members are different from actual ones so that the layers or members have a recognizable size.

In the drawings below, an X-axis, a Y-axis, and a Z-axis are shown as three axes orthogonal to one another for convenience of description, in which the head side of each arrow shown in the drawings is defined as "positive side" and the tail side is defined as "negative side". The Z-axis coincides with a direction in which a semiconductor element and a vibrating element as a physical quantity detection vibrator element are stacked. Moreover, a direction parallel to the X-axis is referred to as "second direction (negative X-axis direction)", a direction parallel to the Y-axis is referred to as "first direction (negative Y-axis direction)", and a direction parallel to the Z-axis is referred to as "Z-axis direction". Further, in a plan view as viewed from the Z-axis direction, a surface in the positive Z-axis direction is defined as an upper surface, and a surface in the negative Z-axis direction is defined as a lower surface, in the description.

Figure 2:
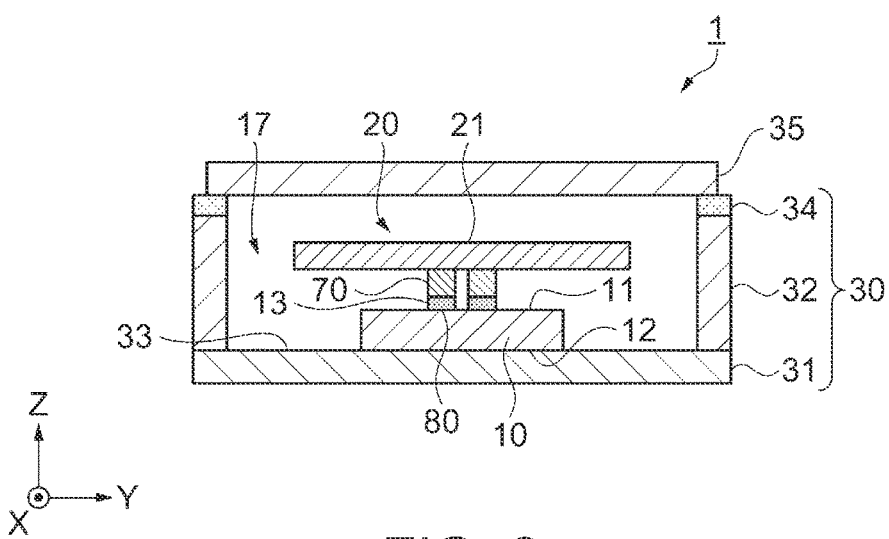
FIG. 2 is a cross-sectional view taken along the line A-A in FIG. 1.

As shown in FIGS. 1 and 2, the vibrating device 1 as one example of the physical quantity detection device of the embodiment includes a semiconductor element 10, a vibrating element (gyro element) 20 as a physical quantity detection vibrator element, and a package 30.

Structure of Vibrating Element

First, the structure of the vibrating element 20 mounted in the vibrating device 1 will be described.

As shown in FIG. 1, the vibrating element 20 of the embodiment is a gyro element having a so-called double T-type configuration and detecting angular velocity in a thickness direction (the Z-axis direction) of the vibrating element 20, that is, angular velocity about the Z-axis as will be described later. The vibrating element 20 includes a base portion 21, a coupling portion, driving vibrating arms as a drive portion, and detecting vibrating arms as a detection portion, all of which are integrally formed by processing a base material as will be described later.

The drive portion includes a first drive portion and a second drive portion. The first drive portion is composed of a first driving vibrating arm 24 and a second driving vibrating arm 25. The second drive portion is composed of a third driving vibrating arm 26 and a fourth driving vibrating arm 27.

More specifically, the vibrating element 20 includes the base portion 21, which is substantially quadrilateral at the center of the vibrating element 20, a first coupling portion 22 as the coupling portion extending from the base portion 21 along a first direction (the negative Y-axis direction), and a second coupling portion 23 as the coupling portion extending from the base portion 21 along a direction (the positive Y-axis direction) opposite to the first direction.

Further, the vibrating element 20 includes the first driving vibrating arm 24 and the second driving vibrating arm 25. The first driving vibrating arm 24 extends along a second direction (the negative X-axis direction) from the tip of the first coupling portion 22 in a direction opposite to the base portion 21. The second driving vibrating arm 25 extends along a direction (the positive X-axis direction) opposite to the second direction from the tip of the first coupling portion 22 in the direction opposite to the base portion 21.

Moreover, the vibrating element 20 includes the third driving vibrating arm 26 and the fourth driving vibrating arm 27. The third driving vibrating arm 26 extends along the second direction (the negative X-axis direction) from the tip of the second coupling portion 23 in a direction opposite to the base portion 21. The fourth driving vibrating arm 27 extends along the direction (the positive X-axis direction) opposite to the second direction from the tip of the second coupling portion 23 in the direction opposite to the base portion 21.

Further, the vibrating element 20 includes a first detecting vibrating arm 28 extending from the base portion 21 along the second direction (the negative X-axis direction) and a second detecting vibrating arm 29 extending from the base portion 21 along the direction (the positive X-axis direction) opposite to the second direction.

In the following, the first coupling portion 22 and the second coupling portion 23 are collectively described as coupling portions 22 and 23; the first driving vibrating arm 24, the second driving vibrating arm 25, the third driving vibrating arm 26, and the fourth driving vibrating arm 27 are collectively described as driving vibrating arms 24 to 27; and the first detecting vibrating arm 28 and the second detecting vibrating arm 29 are collectively described as detecting vibrating arms 28 and 29.

Drive electrodes 51 and 52 for causing the driving vibrating arms 24 to 27 to flexurally vibrate in an XY plane are formed on the driving vibrating arms 24 to 27. Specifically, the drive electrodes 51 and 51 (one on the lower surface side is not shown) are formed on the upper and lower surfaces of the driving vibrating arms 24 to 27, and the drive electrodes 52 and 52 are formed on a pair of side surfaces of the driving vibrating arms 24 to 27.

Detection electrodes 53 and 54 for detecting a potential difference generated in flexural vibration are formed on the detecting vibrating arms 28 and 29. Specifically, the detection electrodes 53 and 53 (one on the lower surface side is not shown) are formed on the upper and lower surfaces of the detecting vibrating arms 28 and 29, and the detection electrodes 54 and 54 are formed on a pair of side surfaces of the detecting vibrating arms 28 and 29.

Moreover, the vibrating element 20 includes a plurality of (four in this example) bonding members 70 disposed on the surfaces of electrodes (not shown) disposed on the lower surface of the base portion 21. On the other hand, the semiconductor element 10, described later, includes connection electrode 13 in a region of a fixing position 80. The bonding member 70 is bonded to the connection electrode 13, whereby the vibrating element 20 is fixed (held) at the fixing position 80.

In the embodiment, the bonding member 70 is, for example, a projecting electrode (projecting terminal) formed using an Au stud bump. However, any material may be used without limitations as long as the material serves as a projecting electrode. In addition to the Au stud bump, other conductive materials such as copper, aluminum, or a solder ball may be used. Moreover, a conductive adhesive obtained by mixing a conductive filler such as silver powders or copper powders with a synthetic resin may be used.

By forming the bonding member 70 in a projecting shape as described above, a gap can be formed between the vibrating element 20 and the semiconductor element 10 in a state of mounting the vibrating element 20 over the semiconductor element 10. As a result, it is possible to avoid contact between the vibrating element 20 and the semiconductor element 10.

Next, weight portions provided at the tips of the driving vibrating arms 24 to 27 and the detecting vibrating arms 28 and 29 will be described. At the tip of the first driving vibrating arm 24, a substantially quadrilateral weight portion 44 having a wider shape than a portion of the first driving vibrating arm on the base portion 21 side is formed. Similarly, a weight portion 45 is formed at the tip of the second driving vibrating arm 25; a weight portion 46 is formed at the tip of the third driving vibrating arm 26; and a weight portion 47 is formed at the tip of the fourth driving vibrating arm 27.

Moreover, at the tip of the first detecting vibrating arm 28, a substantially quadrilateral weight portion 48 having a wider shape than a portion of the first detecting vibrating arm on the base portion 21 side is formed. Similarly, a weight portion 49 is formed at the tip of the second detecting vibrating arm 29. A weight electrode 50 is formed on the upper surface of each of the weight portions 44 to 49.

By providing the weight portions 44 to 49, even when the lengths of the driving vibrating arms 24 to 27 and the detecting vibrating arms 28 and 29 are shortened, the occurrence of a high-order vibration mode is reduced, and thus a resonance frequency is stabilized. As a result, it is possible to stabilize detection sensitivity for angular velocity.

With the mass effect, the vibrating element 20 can be miniaturized, and further, the resonance frequency of the driving vibrating arms 24 to 27 can be lowered. The weight portions 44 to 49 may have a plurality of widths (length in the Y-axis direction) as necessary, or may be omitted.

The weight electrode 50 is used in adjustment of the resonance frequency of the vibrating element 20. That is, a portion of the weight electrode 50 is removed by, for example, a method of irradiating the weight electrode 50 with a laser to change (reduce) the mass and thus change (increase) the resonance frequency of each of the vibrating arms, so that the resonance frequency can be adjusted.

Material of Vibrating Element

Next, the material of the vibrating element 20 mounted in the vibrating device 1 will be described.

For the vibrating element 20, quartz crystal, which is a piezoelectric material, is used as a base material (material constituting a main portion). Quartz crystal has, as crystal axes, an X-axis called an electrical axis, a Y-axis called a mechanical axis, and a Z-axis called an optic axis.

In the embodiment, a so-called quartz crystal Z-plate is used as the base material. The quartz crystal Z-plate is obtained by cutting quartz crystal along a plane defined by the X-axis and the Y-axis orthogonal to each other in the crystal axes of quartz crystal and then processing the cut quartz crystal in a plate shape. The quartz crystal Z-plate has a predetermined thickness in the Z-axis direction orthogonal to the plane. The "predetermined thickness" as used herein is appropriately set depending on the resonance frequency, external sizes, workability, and the like.

For the plate forming the vibrating element 20, errors in the angle of cut from quartz crystal are acceptable within some range about each of the X-axis, the Y-axis, and the Z-axis. For example, a plate cut by being rotated about the X-axis within the range of 0 to 2 degrees can be used. The same applies to the Y-axis and the Z-axis.

Although quartz crystal is used for the vibrating element 20 in the embodiment, other piezoelectric materials, for example, lithium tantalate, lead zirconate titanate, and the like may be used as a base material.

The vibrating element 20 is formed by etching (wet etching or dry etching) using a photolithographic technique, and multiple pieces can be obtained from one quartz crystal wafer.

Operation of Vibrating Element

Next, the operation of the vibrating element 20 mounted in the vibrating device 1 will be described.

By flowing a current from a drive circuit (not shown) provided on the semiconductor element 10 to the drive electrodes 51 and 52 provided in the vibrating element 20, the driving vibrating arms 24 and 25 and the driving vibrating arms 26 and 27 are caused to flexurally vibrate where the driving vibrating arms 24 and 25 and the driving vibrating arms 26 and 27 alternately repeat approaching and receding from each other with its vibration displacement being in the first direction. At this time, electrical noise is generated from the drive electrodes 51 and 52.

Then, angular velocity about the Z-axis due to rotation in a direction vertical to the in-plane of the vibrating element 20, that is, in the Z-axis direction is applied to the vibrating element 20, so that the driving vibrating arms 24 to 27 are subjected to a Coriolis force in the extending direction thereof. In the detecting vibrating arms 28 and 29, detection vibration that displaces the detecting vibrating arms 28 and 29 in the extending direction of the coupling portions 22 and 23 are generated from the driving vibrating arms 24 to 27 subjected to the Coriolis force via the base portion 21. The magnitude of the detection vibration of the detecting vibrating arms 28 and 29 is proportional to the magnitude of the acting Coriolis force, and thus is proportional to the magnitude of the angular velocity.

Hence, the detection electrodes 53 and 54 provided on the detecting vibrating arms 28 and 29 detect a potential difference between the electrodes changed by strain due to the vibration, whereby the vibrating device 1 can obtain the magnitude of the angular velocity.

Structure of Semiconductor Element

Next, the structure of the semiconductor element 10 mounted in the vibrating device 1 will be described.

An integrated circuit (not shown) or the like configured to include a circuit element (not shown) such as a transistor or a memory element and a circuit wiring is formed on an active surface 11 (upper surface) of the semiconductor element 10.

The integrated circuit includes a drive circuit (not shown) for driving and vibrating the vibrating element 20, and a detection circuit (not shown) such as a QV amplifier that detects a voltage difference generated in the vibrating element 20 when angular velocity or the like is applied. Here, the "QV amplifier" means a capacitance variable charge amplifier.

Moreover, the active surface 11 may be provided with a stress buffer layer (not shown) that buffers stress generated between the semiconductor element 10 and the vibrating element 20 due to thermal expansion (contraction).

Electrode Configuration of Semiconductor Element

Next, the electrode configuration of the semiconductor element 10 mounted in the vibrating device 1 will be described.

As previously described, the semiconductor element 10 includes the connection electrodes 13 having electrical continuity with the integrated circuit on the active surface 11 side.

A first insulating film (not shown) serving as a passivation film is formed on the active surface 11, and the first insulating film has openings (not shown) formed on the connection electrodes 13. When the stress buffer layer is provided on the active surface 11, openings are formed on the connection electrodes 13 of the stress buffer layer, and the connection electrodes 13 are exposed in the respective openings to the outside.

The first insulating film can be formed of an inorganic insulating material such as silicon oxide ($SiO_2$) or silicon nitride ($Si_3N_4$). Examples of other materials for forming the first insulating film include resin such as polyimide resin, silicone-modified polyimide resin, epoxy resin, silicone-modified epoxy resin, acrylic resin, phenol resin, BCB (benzocyclobutene), or PBO (polybenzoxazole).

Moreover, the integrated circuit provided on the semiconductor element 10 is provided with, other than the connection electrodes 13, pad electrodes (not shown) and wirings connected with the pad electrodes. The integrated circuit is connected with wiring terminals 14 via the pad electrodes or the wirings. The wiring terminal 14 is formed in a pad shape for establishing electrical or mechanical connection.

The wiring terminals 14 are connected with connection portions 16 provided on a base substrate 31, described later, by, for example, so-called wire bonding performed using wires 15 such as gold (Au) or aluminum (Al).

The connection electrode 13, the pad electrode (not shown), and the wiring terminal 14 are formed of titanium (Ti), titanium nitride (TiN), aluminum (Al), or copper (Cu), or an alloy containing these metals. Especially for the wiring terminal 14, it is preferable that the surface thereof is plated with nickel (Ni), gold (Au), or the like in order to enhance bondability in wire bonding.

By adopting the configuration described above, it is possible to reduce a reduction especially in contact property and bondability due to rust. Moreover, outermost surface treatment such as solder plating or solder precoat may be applied.

Arrangement of Vibrating Element

A feature of the invention resides in that the vibrating element 20 and the semiconductor element 10 are disposed to overlap each other such that at least a portion of the drive electrodes 51 and 52 includes a region not overlapping the semiconductor element 10 in a plan view of the semiconductor element 10. However, in embodiments and a modified example described below, a form in which the driving vibrating arm does not overlap the semiconductor element 10 in the plan view of the semiconductor element 10, that is, a form in which the drive electrodes 51 and 52 provided on the driving vibrating arms do not overlap the semiconductor element 10 is used for description as a form of capable of maximizing advantageous effects of the invention.

Specifically, first in the embodiment, the drive electrodes 51 and 52 formed on the first driving vibrating arm 24 and the second driving vibrating arm 25 are disposed at positions on the first direction side of the semiconductor element 10 and not overlapping the semiconductor element 10.

Moreover, the drive electrodes 51 and 52 formed on the third driving vibrating arm 26 and the fourth driving vibrating arm 27 are disposed at positions on the side of the semiconductor element 10 opposite to the first direction and not overlapping the semiconductor element 10.

Moreover, the base portion 21, the detection electrodes 53 and 54 formed on the detecting vibrating arms 28 and 29, and portions of the coupling portions 22 and 23 are disposed at positions overlapping the semiconductor element 10.

By adopting the configuration described above, compared to a related-art vibrating device in which the entire driving vibrating arm overlaps the semiconductor element, the drive electrodes 51 and 52 disposed on the driving vibrating arms 24 to 27 have a small area facing the circuit (not shown) of the semiconductor element 10.

As a result, a stray capacitance generated between the drive electrodes 51 and 52 and the semiconductor element 10 can be reduced, and at the same time, the influence of electric and magnetic fields generated from the drive electrodes 51 and 52 on the semiconductor element 10 is reduced. Therefore, it is possible to minimize the influence of electrical noise generated from the drive electrodes 51 and 52 on the semiconductor element 10.

Especially the drive electrodes 51 and 52 are disposed at positions not overlapping the detection circuit (QV amplifier) that amplifies the signal from the detection electrodes 53 and 54, whereby it is possible to reduce a deterioration in detection accuracy for angular velocity. Since this can allow a margin for, for example, noise resistance characteristics, it is easy to increase the vibration displacement of the driving vibrating arms 24 to 27 by flowing a current into the drive electrodes 51 and 52. Therefore, it is also possible to improve the detection sensitivity for angular velocity.

Further, since the vibrating element 20 and the semiconductor element 10 are accommodated in the package in an overlapping manner in the plan view of the semiconductor element 10, the vibrating device 1 is miniaturized with a reduction in its planar size.

Moreover, the vibrating element 20 is disposed on the active surface 11 side of the semiconductor element 10, that is, on the side of the integrated circuit disposed on the semiconductor element 10.

The drive electrodes 51 and 52 and the detection electrodes 53 and 54 provided in the vibrating element 20 can be caused to face the pad electrodes (not shown) for the drive and detection circuits of the semiconductor element 10, and connected therewith via the bonding members 70.

Hence, a wiring for establishing electrical continuity between the drive electrodes 51 and 52 and the detection electrodes 53 and 54 and the pad electrodes of the semiconductor element 10 may not be configured on the semiconductor element 10, or the wiring can be shortened. That is, since the wiring path of the current flowing into the drive electrodes 51 and 52 is shortened in the integrated circuit of the semiconductor element 10, it is possible to reduce the influence of electrical noise generated from the wiring of the integrated circuit due to this current on other circuit elements.

On the other hand, the detecting vibrating arms 28 and 29 may be disposed at positions overlapping the semiconductor element 10 in the plan view of the semiconductor element 10.

This is because, since the detecting vibrating arms 28 and 29 generate less electrical noise compared to the drive electrodes 51 and 52, even when the detecting vibrating arms and 29 are disposed at positions overlapping the semiconductor element 10, the detection circuit (QV amplifier) of the semiconductor element 10, for example, is less likely to be influenced by the electrical noise of the detecting vibrating arms 28 and 29. By adopting the configuration described above, the planar size of the vibrating device 1 can be reduced, and thus the vibrating device 1 can be miniaturized.

Package and Lid

Next, the package 30 constituting the vibrating device 1, and a lid 35 will be described.

The package 30 is composed of the base substrate 31, a side wall 32, a seam ring 34, and the like.

In the package 30, the side wall 32 with an annular shape is stacked on the base substrate 31 to thereby from an interior space 17 having a recessed shape in the central portion. The semiconductor element 10, the vibrating element 20, and the like are accommodated in the interior space 17.

The interior space 17 is airtightly sealed in a substantial vacuum by melting the seam ring 34 and bonding the lid 35 to the package in a reduced-pressure atmosphere using, for example, a seam welding apparatus or the like.

The base substrate 31 is formed of, for example, an insulating material such as ceramic. A non-active surface 12 of the semiconductor element 10, which opposes the active surface 11 of the semiconductor element 10, is bonded to a main surface 33 (upper surface) of the base substrate 31 with a bonding material (not shown) such as an adhesive.

Further, the connection portions 16 are formed on the main surface 33. A metal coating such as gold (Au) or silver (Ag) is formed on the surface of the connection portion 16.

The connection portion 16 is connected with an external terminal (not shown) provided on the base substrate 31 by means of a wiring (not shown). Although a configuration of using the wire 15 for connecting the wiring terminal 14 with the connection portion 16 has been described in the embodiment, the connection can be made using a flexible wiring board (FPC (Flexible Printed Circuits)) or the like instead of the wire 15.

The lid 35 is formed by selecting a material such as ceramic, metal, or glass and forming the material in a plate shape. For example, metal generally has the advantage of being less likely to be cracked or chipped than other materials.

According to the vibrating device 1 of the embodiment described above, the following advantageous effects can be obtained.

Compared to the related-art vibrating device in which the entire driving vibrating arm overlaps the semiconductor element, the drive electrodes 51 and 52 disposed on the driving vibrating arms 24 to 27 have a small area facing the circuit (not shown) of the semiconductor element 10.

As a result, a stray capacitance generated between the drive electrodes 51 and 52 and the semiconductor element 10 can be reduced, and at the same time, the influence of the electric and magnetic fields generated from the drive electrodes 51 and 52 on the semiconductor element 10 is also reduced. Therefore, it is possible to minimize the influence of the electrical noise generated from the drive electrodes 51 and 52 on the semiconductor element 10.

Especially the drive electrodes 51 and 52 are disposed so as not to overlap the detection circuit (QV amplifier) that detects the signal from the detection electrodes 53 and 54, so that it is possible to reduce a deterioration in detection accuracy for angular velocity. Since this can allow a margin for, for example, noise resistance characteristics, it is easy to increase the vibration displacement of the driving vibrating arms 24 to 27 by flowing a current into the drive electrodes 51 and 52. Therefore, it is possible to improve the detection sensitivity for angular velocity.

Further, since a portion of the vibrating element 20, which generates less electrical noise, and the semiconductor element 10 are accommodated in the package in an overlapping manner in the plan view of the semiconductor element 10, the vibrating device 1 is miniaturized with a reduction in its planar size.

Moreover, since the vibrating element 20 is disposed on the active surface 11 side of the semiconductor element 10, that is, on the side of the integrated circuit provided on the semiconductor element 10, the drive electrodes 51 and 52 and the detection electrodes 53 and 54 provided in the vibrating element 20 can be directly connected with the pad electrodes (not shown) for the drive and detection circuits of the semiconductor element 10.

In other words, it is possible to eliminate the wiring for establishing electrical continuity between the drive electrodes 51 and 52 and the detection electrodes 53 and 54 of the vibrating element 20 and the pad electrodes for the drive and detection circuits of the semiconductor element 10, or to shorten the wiring. Therefore, the influence of electrical noise can be reduced.

On the other hand, the detection electrodes 53 and 54 generate less electrical noise compared to the drive electrodes 51 and 52. Therefore, even when the detection electrodes 53 and 54 are disposed at positions overlapping the semiconductor element 10, the detection circuit of the semiconductor element 10 is less likely to be influenced by the electrical noise. Based on these facts, the planar size of the vibrating device 1 can be reduced by disposing the detection electrodes 53 and 54 at positions overlapping the semiconductor element 10 in the plan view of the semiconductor element 10, and therefore, the miniaturization can be achieved.

By adopting the configuration called the double T-type described in the embodiment, it is possible to detect the angular velocity about the Z-axis, and vibration modes are symmetrical with the base portion 21 as the central portion. Hence, since the vibrating device 1 is resistant to external vibrations and shocks, and can obtain stable vibration characteristics, the influence of external noise can be reduced, and thus it is possible to reduce false detection of angular velocity or the like applied to the vibrating device 1.

Especially when the drive electrodes 51 and 52 and the semiconductor element 10 do not overlap each other in the plan view of the semiconductor element 10, it is also possible, in a so-called detuning frequency adjusting step for adjusting the resonance frequency of the driving vibrating arms 24 to 27 and the detecting vibrating arms 28 and 29 by removing a portion of the weight electrode 50 described above, to reduce the risk of melting the semiconductor element 10 by a laser beam emitted to the weight electrode 50.

Although a gyro sensor using a double T-type gyro element as a physical quantity detection vibrator element has been described, by way of example, in the embodiment, the physical quantity detection device is not limited to this example. Examples of other physical quantity detection devices may include, for example, a gyro sensor using, as a physical quantity detection vibrator element, a tuning fork-type or H-type gyro element described later.

The vibrating element 20 using, as a base material, quartz crystal that is a piezoelectric material has been described above as one example of the physical quantity detection vibrator element according to the embodiment of the invention. However, the physical quantity detection vibrator element may be a MEMS (Micro Electro Mechanical System) element obtained by forming a mechanically movable structure on a silicon substrate or glass substrate by semiconductor microfabrication technology. The MEMS element is easy to manufacture with a semiconductor circuit incorporated therein, and thus is advantageous in terms of miniaturization and higher functionality.

Second Embodiment

As one example of a physical quantity detection device according to a second embodiment of the invention, a vibrating device 1a (gyro sensor) that detects angular velocity will be described with reference to FIGS. 3 and 4.

Figure 3:
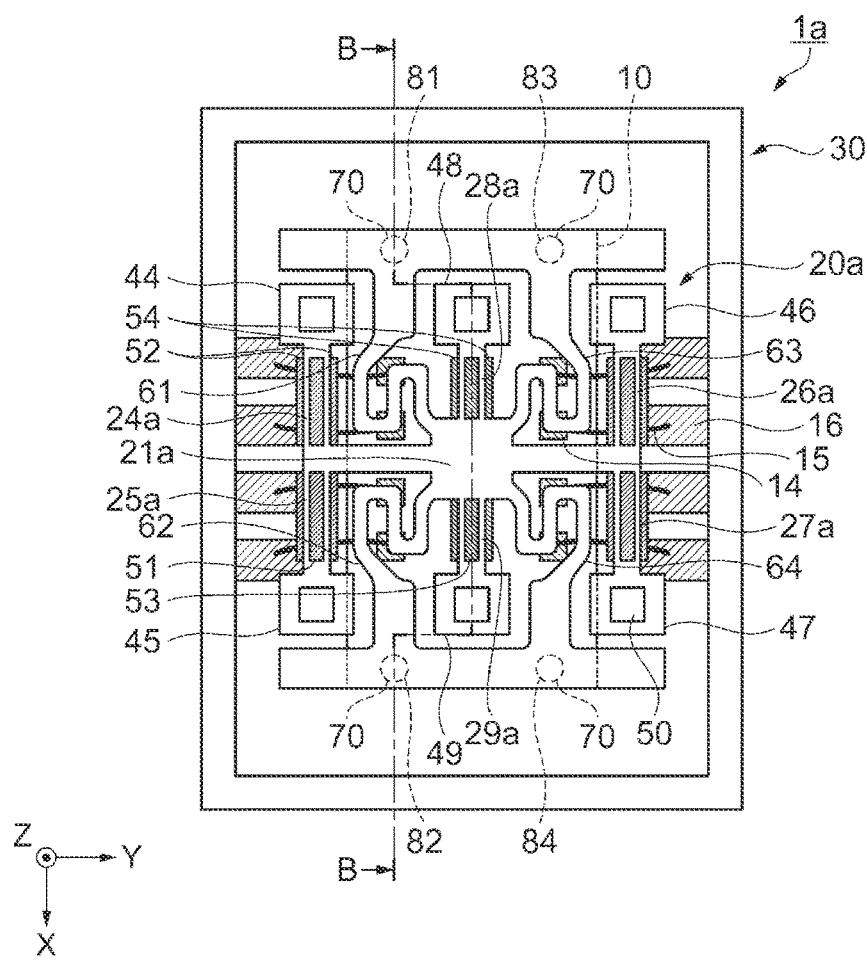
FIG. 3 is a plan view schematically showing a vibrating device as a physical quantity detection device according to a second embodiment.

FIG. 3 is a plan view schematically showing a schematic configuration of the vibrating device according to the second embodiment. FIG. 4 is a cross-sectional view taken along the line B-B in FIG. 3.

As shown in FIG. 3, the vibrating device 1a according to the second embodiment includes the semiconductor element 10, a vibrating element (gyro element) 20a as a physical quantity detection vibrator element, and the package 30. The vibrating device 1a differs from the vibrating device 1 of the first embodiment in the structure of the vibrating element. Portions common to the first embodiment are denoted by the same reference numerals and signs, and the description of the portions is omitted. Portions different from the first embodiment will be mainly described.

Structure of Vibrating Element

As shown in FIG. 3, the vibrating element 20a is also a gyro element having the configuration called the double T-type similarly to the first embodiment. Hence, the operation of the vibrating element is the same as that of the first embodiment. However, the vibrating element 20a does not have the structure in which the vibrating element is connected to the semiconductor element 10 via the bonding members 70 provided on the lower surface of the base portion 21 disposed at the central portion of the vibrating element 20 as in the first embodiment.

The second embodiment has a structure in which the vibrating element 20a is suspended by support portions 61 to 64 extending from the base portion 21a whereby the vibrating element 20a is supported and electrical continuity with the semiconductor element 10 is established. Hereinafter, this structure is referred to as "suspended structure".

Here, the suspended structure will be described.

Figure 4:
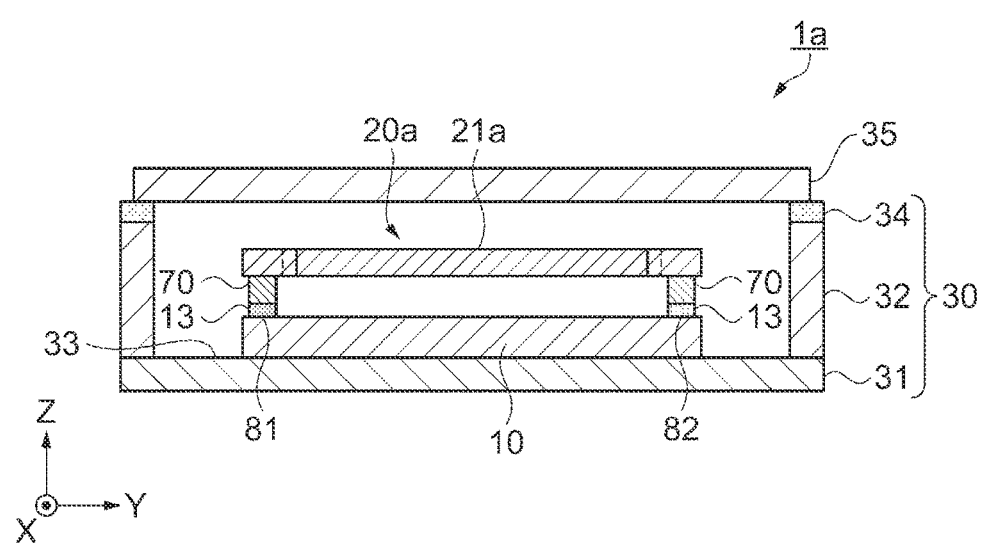
FIG. 4 is a cross-sectional view taken along the line B-B in FIG. 3.

As shown in FIGS. 3 and 4, the support portion 61 extends from a portion of the base portion 21a on the first direction side at an edge thereof on the second direction side, and is fixed (held) via the bonding member 70 to the connection electrode 13 of the semiconductor element 10 at a fixing position 81.

The support portion 62 extends from a portion of the base portion 21a on the first direction side at an edge thereof on the side opposite to the second direction, and is fixed (held) via the bonding member 70 to the connection electrode 13 of the semiconductor element 10 at a fixing position 82.

The support portion 63 extends from a portion of the base portion 21a on the side opposite to the first direction at the edge thereof on the second direction side, and is fixed (held) via the bonding member 70 to the connection electrode 13 of the semiconductor element 10 at a fixing position 83.

The support portion 64 extends from a portion of the base portion 21a on the side opposite to the first direction at the edge thereof on the side opposite to the second direction, and is fixed (held) via the bonding member 70 to the connection electrode 13 of the semiconductor element 10 at a fixing position 84.

The support portions 61 to 64 have a serpentine shape in the XY plane (directions orthogonal to the thickness direction of the support portions). The support portions 61 to 64 are disposed at positions less likely to interfere with driving vibrating arms 24a to 27a and detecting vibrating arms 28a and 29a all of which vibrate.

By adopting the configuration described above, the support portions 61 to 64 extending from the base portion 21a of the vibrating element 20a are fixed in a serpentine shape to the semiconductor element 10. As a result, it is possible to lengthen the support portions 61 to 64 for holding the vibrating element 20 above the semiconductor element 10.

That is, a distance between the driving vibrating arms 24a to 27a and the bonding member 70 fixed to the semiconductor element 10 is lengthened. Hence, it is possible to reduce the transmission of strain generated by fixation to the base portion 21a via the support portions 61 to 64.

Moreover, even when a shock is applied from the outside to the driving vibrating arms 24a to 27a, the support portions 61 to 64 can absorb the shock. Therefore, noise caused by the shock transmitting to the base portion 21a can be reduced, and it is further possible to reduce the occurrence of breakage of the vibrating element 20a.

Arrangement of Vibrating Element

Also in the vibrating element 20a of the second embodiment, the drive electrodes 51 and 52 formed on the first driving vibrating arm 24a and the second driving vibrating arm 25a of the driving vibrating arms 24a to 27a are disposed at positions on the first direction side of the semiconductor element 10 and not overlapping the semiconductor element 10 similarly to the first embodiment.

Moreover, the drive electrodes 51 and 52 formed on the third driving vibrating arm 26a and the fourth driving vibrating arm 27a are disposed at positions on the side of the semiconductor element 10 opposite to the first direction and not overlapping the semiconductor element 10.

As previously described, also in the embodiment, a form in which the driving vibrating arms 24a to 27a do not overlap the semiconductor element 10 in the plan view of the semiconductor element 10, that is, a form in which the drive electrodes 51 and 52 provided on the driving vibrating arms 24a to 27a do not overlap the semiconductor element 10 is used for description as a form of capable of maximizing advantageous effects of the invention.

Moreover, in the plan view of the semiconductor element 10, the first detecting vibrating arm 28a as a detection portion included in the vibrating element 20a is disposed between the base portion 21a and the fixing positions 81 and 83, and the second detecting vibrating arm 29a is disposed between the base portion 21a and the fixing positions 82 and 84.

By adopting the configuration in which the detecting vibrating arms 28a and 29a are disposed between the base portion 21a and the fixing positions 81 to 84, the support portions 61 to 64 for holding the vibrating element 20a above the semiconductor element 10 can be lengthened. Hence, it is possible to reduce the transmission of the strain generated by the fixation to the base portion 21a via the support portions 61 to 64. Therefore, it is possible to obtain the vibrating device 1a with high accuracy in which the influence of the strain caused by holding the vibrating element 20a is reduced.

Moreover, in the plan view of the semiconductor element 10, the semiconductor element 10 is disposed between the first driving vibrating arm 24a and the second driving vibrating arm 25a as a first drive portion and the third driving vibrating arm 26a and the fourth driving vibrating arm 27a as a second drive portion.

By disposing the semiconductor element 10 between the first drive portion (the first driving vibrating arm 24a and the second driving vibrating arm. 25a) and the second drive portion (the third driving vibrating arm 26a and the fourth driving vibrating arm 27a), a distance between the driving vibrating arms 24a to 27a and the detection circuit of the semiconductor element 10 is lengthened compared to the related-art vibrating device in which the driving vibrating arm and the semiconductor element are disposed at positions overlapping each other.

Therefore, it is possible to make it difficult for electrical noise generated due to a current flowing into the drive electrodes 51 and 52 to reach the detection circuit of the semiconductor element 10. Hence, the electrical noise does not interfere with the detection circuit (QV amplifier) of the semiconductor element 10 which amplifies a feeble signal and detects the signal, so that a deterioration in detection accuracy for angular velocity can be reduced.

According to the vibrating device 1a as the physical quantity detection device according to the second embodiment as described above, the following advantageous effects can be obtained in addition to those in the first embodiment. The support portions 61 to 64 extending from the base portion 21a of the vibrating element 20a are fixed in a serpentine shape to the semiconductor element 10, whereby the support portions 61 to 64 for holding the vibrating element 20a above the semiconductor element 10 can be lengthened.

That is, the distance between the driving vibrating arms 24a to 27a and the bonding member 70 fixed to the semiconductor element 10 is lengthened. Hence, it is possible to reduce the transmission of the strain generated by the fixation to the base portion 21a via the support portions 61 to 64.

Moreover, even when a shock is applied from the outside to the driving vibrating arms 24a to 27a, the support portions 61 to 64 can absorb the shock. Therefore, the noise caused by the shock transmitting to the base portion 21a can be reduced. Further, it is also possible to reduce the occurrence of breakage of the vibrating element 20a due to the shock, so that the vibrating device 1a with high reliability can be provided.

Moreover, since two detecting vibrating arms are provided, even when translational acceleration is applied in the first direction to cause a common mode displacement, the displacement can be canceled as an unwanted signal using a differential circuit.

Further, since drive vibration and detection vibration have the same vibration displacement direction, temperature characteristics of the both vibrations are close to each other, and thus a variation in detuning frequency due to a temperature change is small. Hence, it is possible to detect angular velocity with high accuracy.

Moreover, in the plan view of the semiconductor element 10, the semiconductor element 10 is disposed between the first drive portion (the first driving vibrating arm 24a and the second driving vibrating arm. 25a) and the second drive portion (the third driving vibrating arm 26a and the fourth driving vibrating arm 27a). Therefore, the distance between the drive portion and the detection circuit included in the semiconductor element 10 is lengthened compared to the related-art vibrating device in which the drive portion and the semiconductor element are disposed at positions overlapping each other.

Therefore, it is possible to make it difficult for the electrical noise generated due to a current flowing into the drive electrodes 51 and 52 to reach the detection circuit of the semiconductor element 10. Hence, the electrical noise does not interfere with the detection circuit (QV amplifier) of the semiconductor element 10 which amplifies a feeble signal and detects the signal, so that a deterioration in detection accuracy for angular velocity can be reduced.

Modified Example 1

Figure 5:
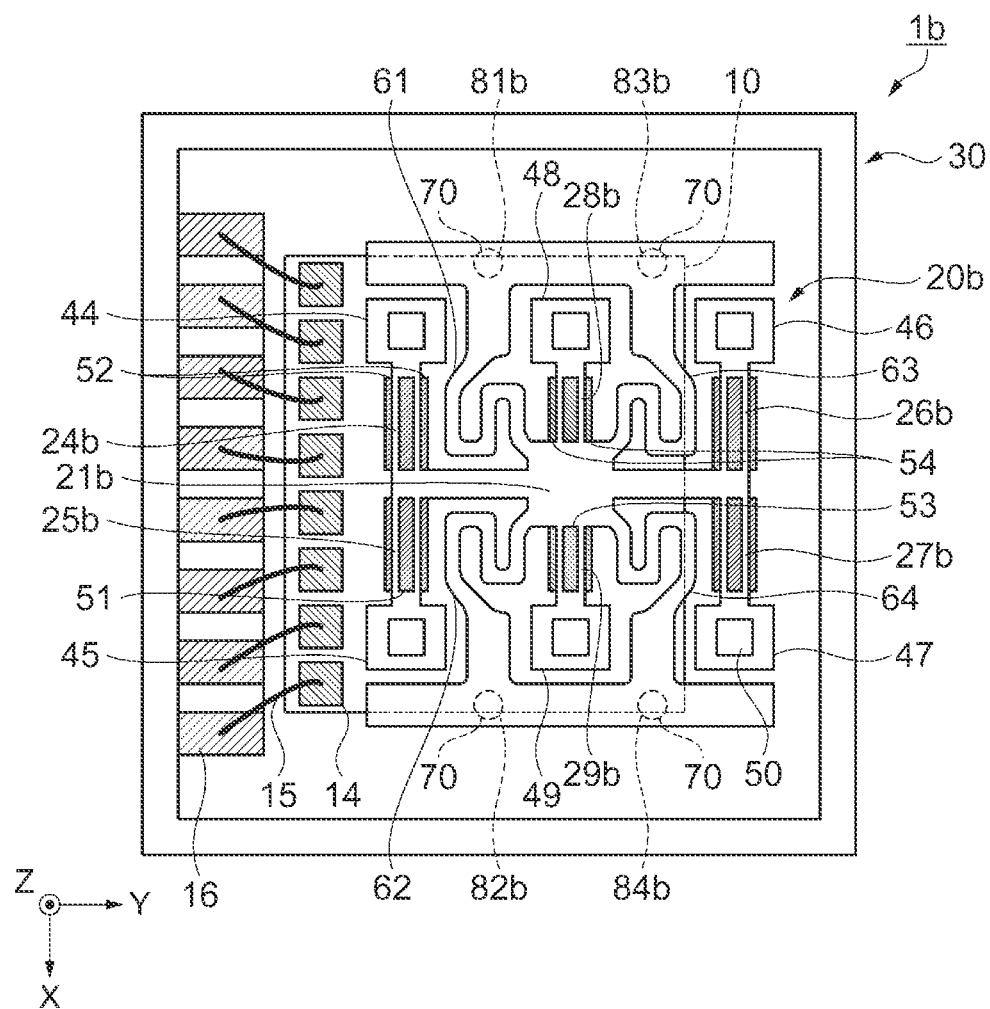
FIG. 5 is a plan view schematically showing a vibrating device as a physical quantity detection device according to Modified Example 1.

Next, a modified example of a vibrating device will be described. FIG. 5 is a plan view schematically showing a schematic configuration of a vibrating device according to Modified Example 1. The vibrating device 1b according to Modified Example 1 differs from the vibrating element 20a of the second embodiment in the mutual positional relationship relative to the semiconductor element 10. Portions common to the first and second embodiments are denoted by the same reference numerals and signs, and the description of the portions is omitted. Portions different from the embodiments will be mainly described.

Arrangement and Structure of Vibrating Element

As shown in FIG. 5, since the vibrating element 20b according to Modified Example 1 is also a gyro element having the structure called the double T-type and the suspended structure similarly to the second embodiment, the operation of the vibrating element is the same as that of the first embodiment. Moreover, the structure is such that the vibrating element 20b is suspended by the support portions 61 to 64 extending from a base portion 21b whereby the vibrating element 20b is supported and electrical continuity with the semiconductor element 10 is established.

The vibrating device 1b according to Modified Example 1 has a structure in which, in driving vibrating arms 24b to 27b, the third driving vibrating arm 26b and the fourth driving vibrating arm 27b are disposed on the side of the base portion 21b opposite to the first direction, and the drive electrodes 51 and 52 formed on the third driving vibrating arm 26b and the fourth driving vibrating arm 27b do not overlap the semiconductor element 10.

In other words, the drive electrodes 51 and 52 formed on the third driving vibrating arm 26b and the fourth driving vibrating arm 27b provided on the side opposite to the first direction relative to the base portion 21b are disposed at positions not overlapping the semiconductor element 10.

As previously described, also in Modified Example 1, a form in which the third driving vibrating arm 26b and the fourth driving vibrating arm 27b do not overlap the semiconductor element 10 in the plan view of the semiconductor element 10, that is, a form in which the drive electrodes 51 and 52 disposed on the third driving vibrating arm 26b and the fourth driving vibrating arm 27b do not overlap the semiconductor element 10 is used for description as a form of capable of maximizing advantageous effects of the invention.

However, in Modified Example 1, the first driving vibrating arm 24b and the second driving vibrating arm 25b provided on the first direction side relative to the base portion 21b are disposed at positions overlapping the semiconductor element 10. That is, Modified Example 1 is an example in which the wiring terminals 14 provided on the semiconductor element 10 and the connection portions 16 provided in the package 30 are wire bonded together only on the first direction side.

Moreover, a first detecting vibrating arm 28b and a second detecting vibrating arm 29b are also disposed at positions overlapping the semiconductor element 10 because the first detecting vibrating arm 28b and the second detecting vibrating arm 29b generate less electrical noise compared to the driving vibrating arms 24b to 27b.

The suspended structure according to Modified Example 1 can be described similarly to the second embodiment. That is, the support portions 61 to 64 are fixed (held) via the bonding members 70 to the connection electrodes 13 of the semiconductor element 10 at fixing positions 81b to 84b, whereby the vibrating element 20b is mounted above the semiconductor element 10 while establishing electrical continuity.

According to the vibrating device 1b as a physical quantity detection device according to Modified Example 1, the following advantageous effect can be obtained in addition to those in the second embodiment. Modified Example 1 has the structure in which the third driving vibrating arm. 26b and the fourth driving vibrating arm 27b disposed on the side of the base portion 21b opposite to the first direction do not overlap the semiconductor element 10.

Hence, compared to the structure (the second embodiment) in which the driving vibrating arms not overlapping the semiconductor element 10 on both sides thereof are disposed, limitations on the fixing positions 81b to 84b at which the support portions 61 to 64 extending from the base portion 21b are bonded to the semiconductor element 10, or on the arrangement of the fixing positions 81b to 84b are reduced, so that it is possible to freely design a layout.

Third Embodiment

Next, a vibrating device as a physical quantity detection device according to a third embodiment of the invention will be described.

Figure 6:
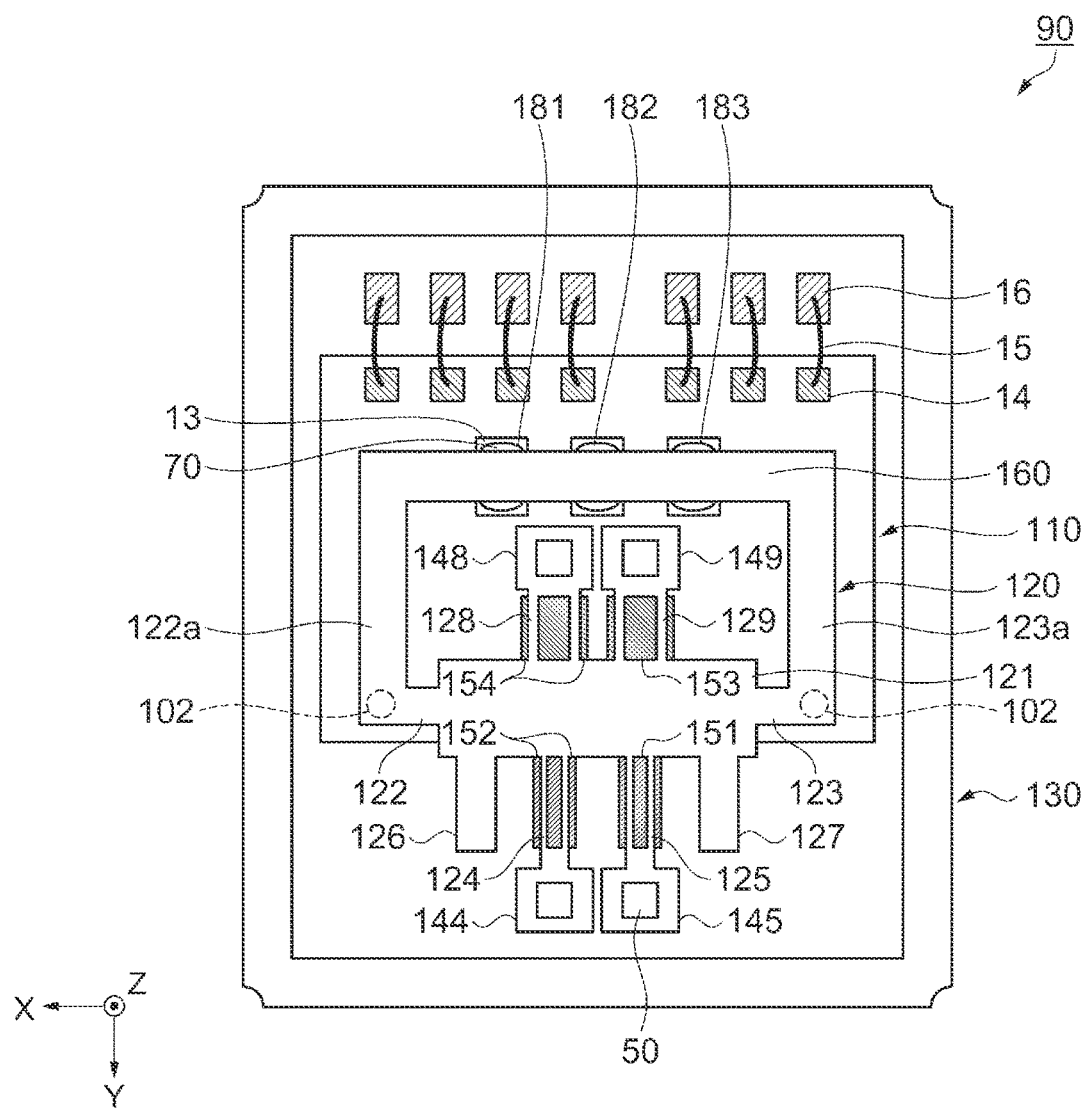
FIG. 6 is a plan view schematically showing a vibrating device as a physical quantity detection device according to a third embodiment.

FIG. 6 is a plan view schematically showing the vibrating device as the physical quantity detection device according to the third embodiment. A description overlapping the first and second embodiments is omitted.

As shown in FIG. 6, the vibrating device 90 according to the third embodiment includes, similarly to the first embodiment, a semiconductor element 110, a vibrating element (gyro element) 120 as a physical quantity detection vibrator element, and a package 130. However, different from the first embodiment, the vibrating device 90 is a gyro sensor in which a gyro element having a so-called H-type configuration and detecting angular velocity about the Y-axis along the in-plane direction of the vibrating element 120, that is, herein in the extending direction of the driving vibrating arm is mounted.

Structure of Vibrating Element

The vibrating element 120 includes: a substantially quadrilateral base portion 121 located on the side of the vibrating element 120 opposite to the first direction; a first driving vibrating arm 124 and a second driving vibrating arm 125 that extend in the direction opposite to the first direction from an edge of the base portion 121 on the side opposite to the first direction; and a first detecting vibrating arm 128 and a second detecting vibrating arm 129 that extend in the first direction from an edge of the base portion 121 in the first direction.

As described above, the vibrating element 120 has the shape in which, from the respective edges of the base portion 121 in the first direction, the first driving vibrating arm 124 and the second driving vibrating arm 125 extend in the same direction and the first detecting vibrating arm 128 and the second detecting vibrating arm 129 extend in the same direction, and therefore, the vibrating element 120 is called an H-type vibrating element (H-type gyro element).

Moreover, a first coupling portion 122, a first extending portion 122a, a second coupling portion 123, and a second extending portion 123a are formed in the vibrating element 120. The first coupling portion 122 extends in the direction opposite to the second direction from one end of the base portion 121; the first extending portion 122a extends in the first direction from the first coupling portion 122; the second coupling portion 123 extends in the second direction from the other end of the base portion 121; and the second extending portion 123a extends in the first direction from the second coupling portion 123.

Further, the first extending portion 122a and the second extending portion 123a are extended and coupled together to form a support portion 160. The support portion 160 is provided so as to face the detecting vibrating arms 128 and 129, and is provided with pad electrodes (not shown) to fix the vibrating element 120 to the semiconductor element 110.

The pad electrodes are fixed (held) via the bonding members 70 to the connection electrodes 13 of the semiconductor element 110 at fixing positions 181, 182, and 183, whereby the vibrating element 120 is mounted on the semiconductor element 110 while establishing electrical connection.

Arrangement of Vibrating Element

In the vibrating device 90 according to the embodiment, the vibrating element 120 is such that drive electrodes 151 and 152 formed on the first driving vibrating arm 124 and the second driving vibrating arm 125 are disposed at positions on the side of the semiconductor element 110 opposite to the first direction and not overlapping the semiconductor element 110.

As previously described, also in the embodiment, a form in which the first driving vibrating arm 124 and the second driving vibrating arm 125 do not overlap the semiconductor element 110 in a plan view of the semiconductor element 110, that is, a form in which the drive electrodes 151 and 152 disposed on the first driving vibrating arm 124 and the second driving vibrating arm 125 do not overlap the semiconductor element 110 is used for description as a form of capable of maximizing advantageous effects of the invention.

By adopting the configuration described above, compared to the related-art vibrating device in which the driving vibrating arm and the semiconductor element are disposed at positions overlapping each other, the drive electrodes 151 and 152 disposed on the driving vibrating arms 124 and 125 have a small area facing a circuit (not shown) of the semiconductor element 110 similarly to the first embodiment.

As a result, a stray capacitance generated between the drive electrodes 151 and 152 and the semiconductor element 110 can be reduced, and at the same time, the influence of electric and magnetic fields generated from the drive electrodes 151 and 152 on the semiconductor element 110 is reduced. Therefore, it is possible to minimize the influence of electrical noise generated from the drive electrodes 151 and 152 on the semiconductor element 110.

Especially the drive electrodes 151 and 152 are disposed so as not to overlap a detection circuit (QV amplifier) that amplifies the signal from detection electrodes 153 and 154, whereby a deterioration in detection accuracy for angular velocity can be reduced. Since this can allow a margin for, for example, noise resistance characteristics, it is easy to increase the vibration displacement of the driving vibrating arms 124 and 125 and driving vibrating arms 126 and 127 by flowing a current into the drive electrodes 151 and 152. Therefore, it is also possible to improve the detection sensitivity for angular velocity.

Further, since a portion of the vibrating element 120, which generates less electrical noise, and the semiconductor element 110 are accommodated in the package in an overlapping manner in the plan view of the semiconductor element 110, the vibrating device 90 is miniaturized with a reduction in its planar size.

Moreover, since the vibrating device is the gyro sensor having the so-called H-type structure in the third embodiment, the driving vibrating arms 124 and 125 and the detecting vibrating arms 128 and 129 extend from the respective edges of the base portion 121 in the same axial direction. Therefore, the drive portion and the detection portion are separated from each other. Hence, the third embodiment has a feature that electrical noise such as electrostatic coupling between the drive electrodes 51 and 52 and the detection electrodes 153 and 154 or between wirings is reduced and thus vibration characteristics are stabilized.

Further, by driving the first driving vibrating arm 124 and the second driving vibrating arm 125 together, excitation efficiency can be improved to reduce the equivalent series resistance value (CI (Crystal Impedance) value) of the vibrating element 120, and accordingly, consumption current can be reduced. Therefore, the detection sensitivity for angular velocity is improved, so that the vibrating device 90 advantageous also in terms of miniaturization can be provided.

Weight portions 144, 145, 148, and 149 are provided at the tips of the driving vibrating arms 124 and 125 and the detecting vibrating arms 128 and 129 of the embodiment. The weight electrodes 50 are formed on the upper surfaces of the weight portions 144, 145, 148, and 149, so that the resonance frequency of each of the vibrating arms can be adjusted.

The drive electrodes 151 and 152 for flexurally vibrating the driving vibrating arms 124 and 125 are formed on the driving vibrating arms 124 and 125. The detection electrodes 153 and 154 for detecting a potential difference in flexural vibration of the detecting vibrating arms 128 and 129 are formed on the detecting vibrating arms 128 and 129.

The vibrating element 120 includes a first adjustment vibrating arm 126 and a second adjustment vibrating arm 127 that extend in a direction (direction opposite to the second direction) intersecting the crystal X-axis (electrical axis) of quartz crystal. In the vibrating element 120 of the embodiment, the first adjustment vibrating arm 126 and the second adjustment vibrating arm 127 extend, from respective end portions of the base portion 121 in a direction (the second direction) orthogonal to the extending direction of the first driving vibrating arm 124, the second driving vibrating arm 125, the first detecting vibrating arm 128, and the second detecting vibrating arm 129, in a direction opposite to the first direction and parallel to the first driving vibrating arm 124 and the second driving vibrating arm 125.

The first adjustment vibrating arm 126 and the second adjustment vibrating arm 127 are formed such that the length thereof in the first direction is smaller than the lengths of the first driving vibrating arm 124, the second driving vibrating arm 125, the first detecting vibrating arm 128, and the second detecting vibrating arm 129. Due to this, the vibration of the first adjustment vibrating arm 126 and the second adjustment vibrating arm 127 for adjusting leakage output is less likely to hinder the main vibration of the vibrating element 120 caused by the first driving vibrating arm 124, the second driving vibrating arm 125, the first detecting vibrating arm 128, and the second detecting vibrating arm 129. Therefore, the vibration characteristics of the vibrating element 120 are stabilized, and at the same time, this form is advantageous in terms of miniaturization of the vibrating element 120.

Element holding portions 102 having approximately the same thickness as the support portion 160 are provided on the active surface side of the semiconductor element 110 at positions facing the first coupling portion 122 and the second coupling portion 123 of the vibrating element 120. The element holding portion 102 is preferably formed of a soft material, for example, polyimide-based resin, silicone-based resin, urethane-based resin, or the like.

The element holding portions 102 can reliably keep a space between the semiconductor element 110 and the vibrating element 120, and also can function as buffers that reduce the breakage of the vibrating element 120 due to a shock being applied to the vibrating device 90 and causing the vibrating element 120 to warp and collide with the semiconductor element 110.

If a sufficient gap can be provided between the vibrating element 120 and the semiconductor element 110, the element holding portion 102 may not be provided.

Operation of Vibrating Element

Next, the operation of the vibrating element 120 mounted in the vibrating device 90 will be described. When a predetermined AC voltage is applied to the drive electrodes 151 and 152 provided in the vibrating element 120, the driving vibrating arms 124 and 125 flexurally vibrate in opposite directions in the XY in-plane direction, that is, in directions in which the driving vibrating arms 124 and 125 approach and recede from each other.

In this state, when the vibrating element 120 rotates about the Y-axis as the extending direction of the driving vibrating arms, the driving vibrating arms 124 and 125 flexurally vibrate, with the action of a Coriolis force generated in response to the angular velocity of the rotation, in opposite directions from each other in the out-of-plane direction (the Z-axis direction). Due to resonance with the vibration in the Z-axis direction, the detecting vibrating arms 128 and 129 flexurally vibrate in opposite directions from each other in the same Z-axis direction. At this time, the vibration direction of the detecting vibrating arms 128 and 129 is in the opposite mode to that of the driving vibrating arms 124 and 125.

That is, the flexural vibration is such that when the first driving vibrating arm 124 vibrates in the positive Z-axis direction, the second driving vibrating arm 125 vibrates in the negative Z-axis direction. The flexural vibration of the driving vibrating arms 124 and 125 is transmitted to the detecting vibrating arms 128 and 129 via the base portion 121, so that the detecting vibrating arms 128 and 129 are resonated. This results in flexural vibration such that when the first detecting vibrating arm 128 vibrates in the negative Z-axis direction, the second detecting vibrating arm 129 vibrates in the positive Z-axis direction. In the flexural vibration, a potential difference generated between the detection electrodes 153 and 154 of the detecting vibrating arms 128 and 129 is extracted, whereby the angular velocity applied to the vibrating device 90 is obtained.

As described above, according to the vibrating element 120 as a physical quantity detection device according to the third embodiment, the following advantageous effects can be obtained in addition to those in the first and second embodiments.

In the third embodiment, since the vibrating device is a gyro sensor having the so-called H-type structure, the driving vibrating arms 124 and 125 and the detecting vibrating arms 128 and 129 extend from the respective edges of the base portion in the same axial direction, and thus it is possible to detect the angular velocity about the axis (the second direction) along the extending direction of the driving vibrating arms 124 and 125, that is, the angular velocity along the Y-axis.

Moreover, since the driving vibrating arms 124 and 125 and the detecting vibrating arms 128 and 129 extend from the respective edges of the base portion 121 in the same axial direction, the drive portion and the detection portion are separated from each other. Hence, electrical noise such as electrostatic coupling between the drive electrodes 151 and 152 and the detection electrodes 153 and 154 or between wirings is reduced, and thus vibration characteristics are stabilized.

Further, by driving the first driving vibrating arm 124 and the second driving vibrating arm 125 together, excitation efficiency can be improved to reduce the equivalent series resistance value, and accordingly, consumption current can be reduced. Therefore, the detection sensitivity for angular velocity is improved, so that the vibrating device 90 advantageous also in terms of miniaturization can be provided.

Electronic Apparatus

Next, an electronic apparatus according to an embodiment will be described with reference to the drawings. The electronic apparatus according to the embodiment includes the vibrating device 1, 1a, 1b, or 90 as a physical quantity detection device according to the invention. In the following, an electronic apparatus including the vibrating device 1 according to the invention will be described.

Figure 7:
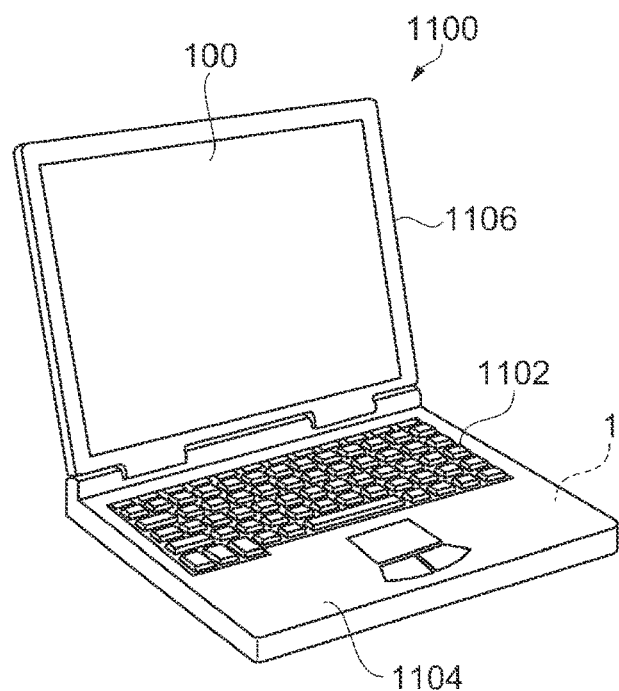
FIG. 7 is a perspective view showing a configuration of a mobile personal computer as one example of an electronic apparatus.

FIG. 7 is a perspective view schematically showing a mobile (or notebook) personal computer 1100 as the electronic apparatus according to the embodiment. As shown in FIG. 7, the personal computer 1100 is composed of a main body portion 1104 including a keyboard 1102, and a display unit 1106 including a display portion 100. The display unit 1106 is rotatably supported to the main body portion 1104 via a hinge structure portion. Into the personal computer 1100, the vibrating device 1 having a function of detecting angular velocity is built.

Figure 8:
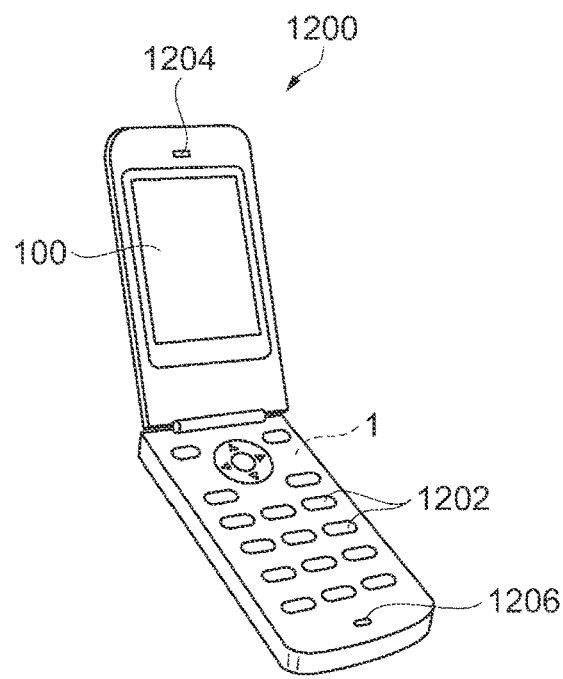
FIG. 8 is a perspective view showing a configuration of a mobile phone as one example of an electronic apparatus.

FIG. 8 is a perspective view schematically showing a mobile phone (including a PHS) 1200 as the electronic apparatus according to the embodiment. As shown in FIG. 8, the mobile phone 1200 includes a plurality of operation buttons 1202, an earpiece 1204, and a mouthpiece 1206. The display portion 100 is disposed between the operation buttons 1202 and the earpiece 1204. Into the mobile phone 1200, the vibrating device 1 according to the invention is built for detecting angular velocity used for a camera shake correction function.

Figure 9:
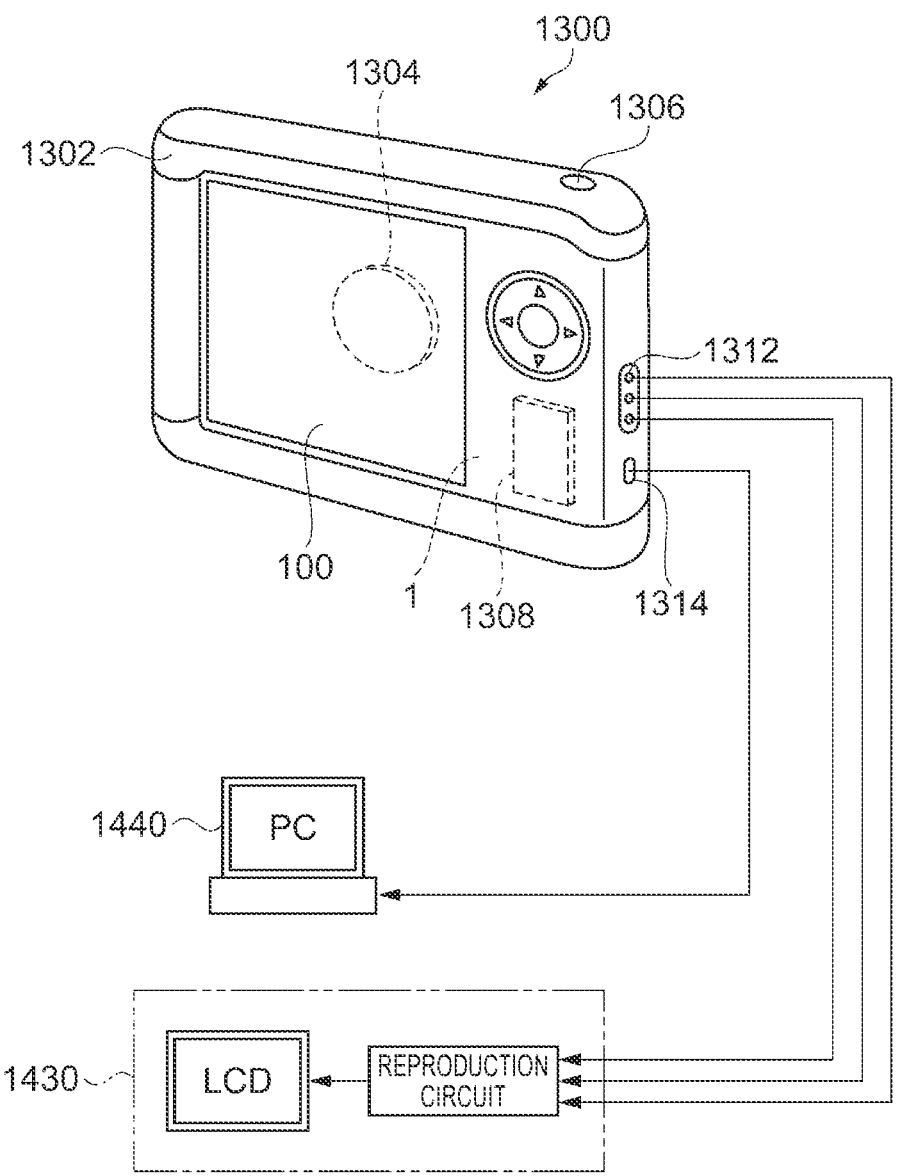
FIG. 9 is a perspective view showing a configuration of a digital camera as one example of an electronic apparatus.

FIG. 9 is a perspective view schematically showing a digital camera 1300 as the electronic apparatus according to the embodiment. In FIG. 9, connections with external apparatuses are also shown in a simplified manner. Here, usual cameras expose a silver halide photographic film with an optical image of a subject, whereas the digital camera 1300 photoelectrically converts the optical image of the subject with an imaging device such as a CCD (Charge Coupled Device) to generate imaging signals (image signals).

The display portion 100 is provided on a back surface of a case (body) 1302 in the digital camera 1300 and configured to perform display based on the imaging signals generated by the CCD. The display portion 100 functions as a finder that displays the subject as an electronic image. Moreover, on the front side (the rear side in the drawing) of the case 1302, a light receiving unit 1304 including an optical lens (imaging optical system) and the CCD is provided.

When a photographer confirms the subject image displayed on the display portion 100 and presses down a shutter button 1306, imaging signals of the CCD at the time are transferred to and stored in a memory 1308. In the digital camera 1300, a video signal output terminal 1312 and a data communication input/output terminal 1314 are provided on a side surface of the case 1302. A television monitor 1430 and a personal computer 1440 are connected as necessary to the video signal output terminal 1312 and the data communication input/output terminal 1314, respectively.

Further, the imaging signals stored in the memory 1308 are output to the television monitor 1430 or the personal computer 1440 by a predetermined operation. Into the digital camera 1300, the vibrating device 1 according to the invention is built for detecting angular velocity used for a camera shake correction function.

In addition to the personal computer (mobile personal computer) 1100 shown in FIG. 7, the mobile phone 1200 shown in FIG. 8, and the digital camera 1300 shown in FIG. 9, examples of the electronic apparatus including the vibrating device 1 include, for example, an inkjet ejection apparatus (e.g., an inkjet printer), a laptop personal computer, a television set, a video camcorder, a head-mounted display, a video tape recorder, various types of navigation systems, a pager, an electronic notebook (including one with communication function), an electronic dictionary, a calculator, an electronic gaming machine, a word processor, a workstation, a videophone, a surveillance television monitor, electronic binoculars, a POS terminal, a medical apparatus (e.g. an electronic thermometer, a sphygmomanometer, a blood glucose meter, an electrocardiogram measuring system, an ultrasonic diagnosis apparatus, and an electronic endoscope), a fishfinder, various types of measuring instrument, indicators (e.g., indicators used in a vehicle, aircraft, a rocket, and a ship), the attitude control of a robot or the human body, and a flight simulator.

Moving Object

Next, a moving object including the vibrating device 1 as a physical quantity detection device according to one embodiment of the invention will be described with reference to FIG. 10.

Figure 10:
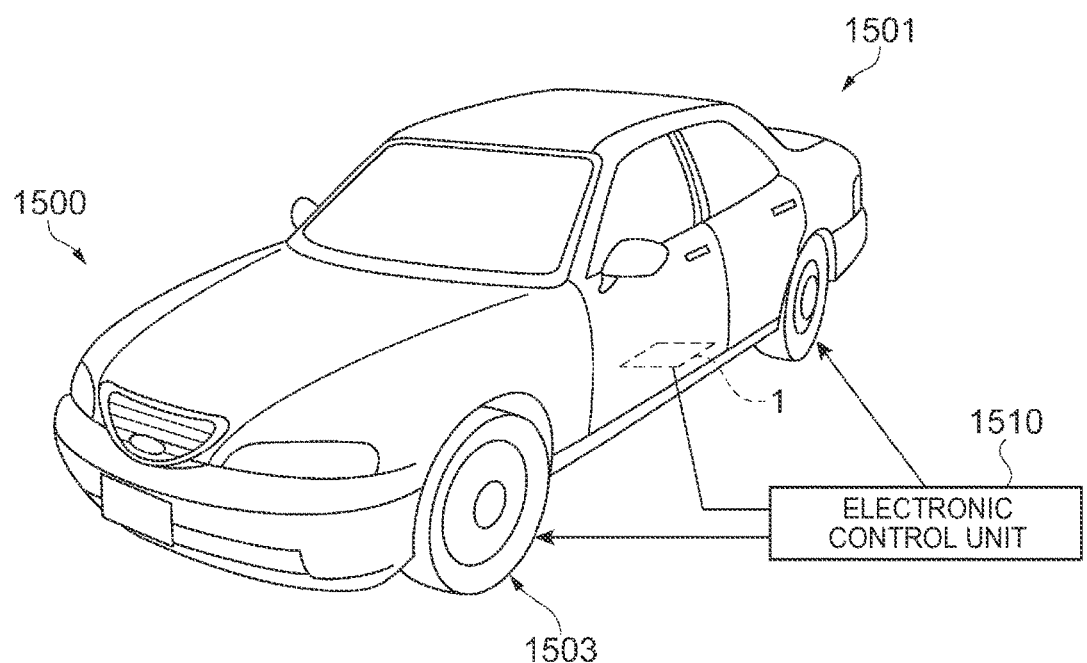
FIG. 10 is a perspective view showing a configuration of an automobile as one example of a moving object.

FIG. 10 is a perspective view schematically showing an automobile 1500 as one example of the moving object according to the embodiment. The vibrating device 1 including the vibrating element 20 according to the invention is mounted in the automobile 1500.

For example, as shown in FIG. 10, an electronic control unit 1510 into which the vibrating device 1 is built to control tires 1503 or the like is mounted in a car body 1501 of the automobile 1500 as the moving object in order to detect angular velocity to control the attitude of the automobile 1500.

In addition, the vibrating device 1 is used as a navigation system or the like. Further, without limiting to the automobile 1500, the vibrating device 1 can be suitably used as an attitude detection sensor for a moving object including a self-propelled robot, a self-propelled conveying apparatus, a train, a ship, an airplane, and an artificial satellite.

The invention includes a configuration (e.g., a configuration having the same function, method, and result, or a configuration having the same advantage and advantageous effect) which is substantially the same as those described in the embodiments. Moreover, the invention includes a configuration in which a non-essential portion of the configurations described in the embodiments is replaced. Moreover, the invention includes a configuration providing the same operational effects as those described in the embodiments, or a configuration capable of achieving the same advantages. Moreover, the invention includes a configuration in which a publicly known technique is added to the configurations described in the embodiments.

CROSS-REFERENCE TO RELATED APPLICATIONS

The entire disclosure of Japanese Patent Application No: 2014-187354, filed Sep. 16, 2014 is expressly incorporated by reference herein.

What is claimed is:

1. A physical quantity detection device comprising:
a semiconductor element; and
a physical quantity detection vibrator element, a portion of which overlaps the semiconductor element in a plan view of the semiconductor element, wherein
the physical quantity detection vibrator element includes
a drive portion including a drive electrode, and
a detection portion,
at least a partial region of the drive electrode does not overlap the semiconductor element in the plan view of the semiconductor element, and
the detection portion overlaps the semiconductor element in the plan view of the semiconductor element.

2. The physical quantity detection device according to claim 1, wherein
the physical quantity detection vibrator element is disposed on an active surface side of the semiconductor element.

3. The physical quantity detection device according to claim 1, wherein
the physical quantity detection vibrator element includes
a base portion, and
a support portion extending from the base portion,
the support portion is connected at a fixing position of the semiconductor element, and
the detection portion is disposed between the base portion and the fixing position in the plan view of the semiconductor element.

4. The physical quantity detection device according to claim 1, wherein
the physical quantity detection vibrator element includes a base portion,
the drive portion includes first and second driving vibrating arms extending from one edge of the base portion, and
the detection portion includes first and second detecting vibrating arms extending from another edge of the base portion on the side opposite to the one edge.

5. An electronic apparatus comprising the physical quantity detection device according to claim 1.

6. A moving object comprising the physical quantity detection device according to claim 1.

7. A physical quantity detection device comprising:
a semiconductor element; and
a physical quantity detection vibrator element, a portion of which overlaps the semiconductor element in a plan view of the semiconductor element, wherein
the physical quantity detection vibrator element includes
a drive portion including a drive electrode, and
a detection portion,
at least a partial region of the drive electrode does not overlap the semiconductor element in the plan view of the semiconductor element, and
in the plan view of the semiconductor element, the drive portion includes a first drive portion and a second drive portion, and the semiconductor element is disposed between the first drive portion and the second drive portion.

8. An electronic apparatus comprising the physical quantity detection device according to claim 7.

9. A moving object comprising the physical quantity detection device according to claim 7.

10. A physical quantity detection device comprising:
a semiconductor element; and
a physical quantity detection vibrator element, a portion of which overlaps the semiconductor element in a plan view of the semiconductor element, wherein
the physical quantity detection vibrator element includes
a drive portion including a drive electrode, and
a detection portion,
at least a partial region of the drive electrode does not overlap the semiconductor element in the plan view of the semiconductor element,
the physical quantity detection vibrator element includes
a base portion,
a first coupling portion extending from the base portion along a first direction, and
a second coupling portion extending from the base portion along a direction opposite to the first direction,
the drive portion includes
a first driving vibrating arm extending from the first coupling portion along a second direction intersecting the first direction,
a second driving vibrating arm extending from the first coupling portion along a direction opposite to the second direction,
a third driving vibrating arm extending from the second coupling portion along the second direction, and
a fourth driving vibrating arm extending from the second coupling portion along the direction opposite to the second direction, and
the detection portion includes
a first detecting vibrating arm extending from the base portion along the second direction, and
a second detecting vibrating arm extending from the base portion along the direction opposite to the second direction.

11. An electronic apparatus comprising the physical quantity detection device according to claim 10.

12. A moving object comprising the physical quantity detection device according to claim 10.

* * * * *